(12) United States Patent  
Drynan et al.

(10) Patent No.: US 7,019,347 B2  
(45) Date of Patent: Mar. 28, 2006

(54) DYNAMIC RANDOM ACCESS MEMORY CIRCUITRY COMPRISING INSULATIVE COLLARS

(75) Inventors: John M. Drynan, Boise, ID (US); Thomas A. Figura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/031,478

(22) Filed: Jan. 7, 2005

(65) Prior Publication Data

US 2005/0124163 A1 Jun. 9, 2005

Related U.S. Application Data

(60) Continuation of application No. 10/264,676, filed on Oct. 3, 2002, now Pat. No. 6,861,713, which is a division of application No. 09/999,513, filed on Oct. 24, 2001, now Pat. No. 6,645,846.

(51) Int. Cl.  
*H01L 27/108* (2006.01)  
*H01L 29/76* (2006.01)

(52) U.S. Cl. ........................ 257/296; 257/297; 257/382; 257/774

(58) Field of Classification Search ................. 257/296  
See application file for complete search history.

(56) References Cited

U.S. PATENT DOCUMENTS

| | | | |
|---|---|---|---|
| 6,033,981 A | 3/2000 | Lee et al. | 438/624 |
| 6,080,621 A | 6/2000 | Wang et al. | 438/253 |
| 6,168,989 B1 | 1/2001 | Chiang et al. | 438/253 |
| 6,194,313 B1 | 2/2001 | Singh et al. | 438/675 |
| 6,239,022 B1 | 5/2001 | Seo et al. | 438/629 |
| 6,380,042 B1 | 4/2002 | Huang | 438/303 |
| 6,476,488 B1 | 11/2002 | Jeng et al. | 257/751 |
| 6,566,241 B1 | 5/2003 | Chun | 438/618 |
| 6,861,713 B1 * | 3/2005 | Drynan et al. | 257/382 |
| 2002/0110975 A1 | 8/2002 | Parekh et al. | 438/239 |

* cited by examiner

*Primary Examiner*—Thanh Nguyen  
(74) *Attorney, Agent, or Firm*—Wells St. John P.S.

(57) ABSTRACT

A method of forming a conductive contact to a conductive structure includes forming a conductive structure received within and projecting outwardly from a first insulative material. A second different insulative material is deposited. The second insulative material is anisotropically etched effective to form a sidewall etch stop for the conductive structure. A third insulative material is deposited over the conductive structure and the sidewall etch stop. The third insulative material is different in composition from the second insulative material. A contact opening is etched through the third insulative material to the conductive structure using an etch chemistry which is substantially selective to the second insulative material of the sidewall etch stop. Integrated circuitry independent of the method of fabrication is disclosed.

10 Claims, 7 Drawing Sheets

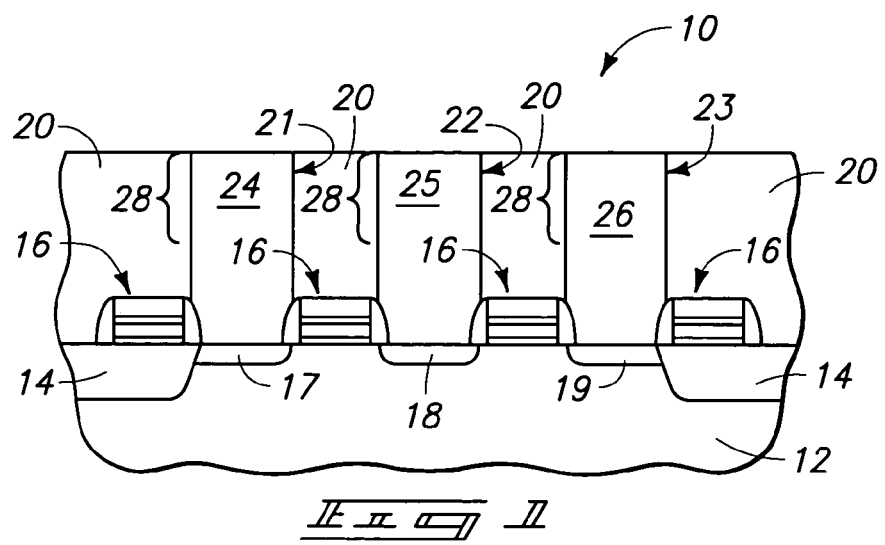
_Fig. 1_
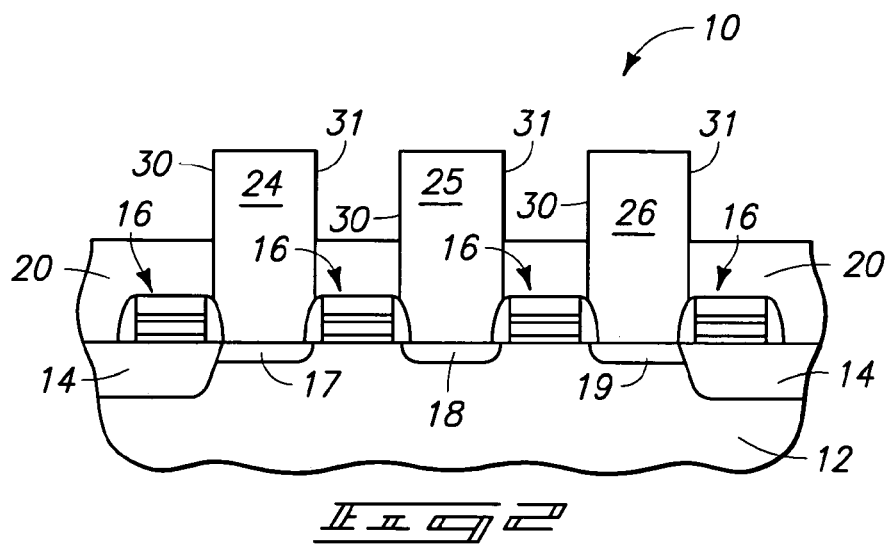
_Fig. 2_
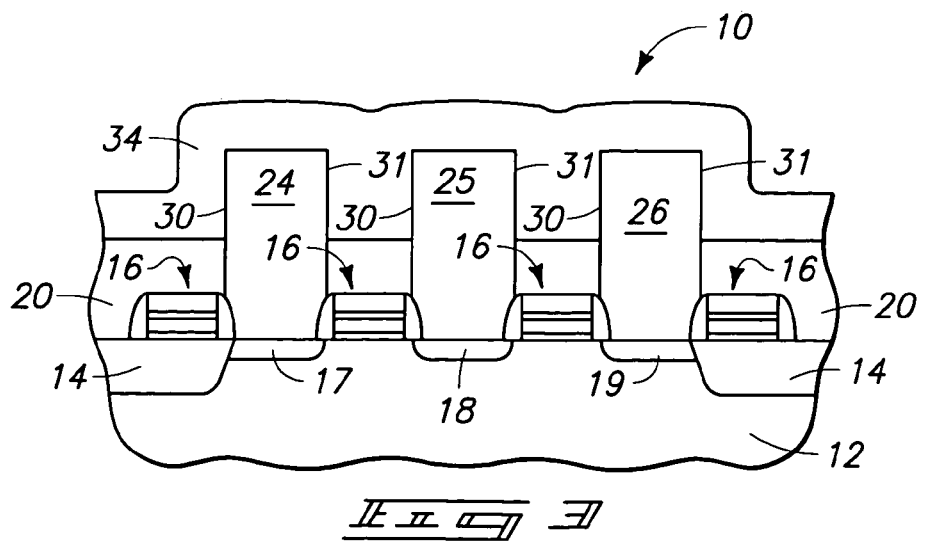
_Fig. 3_

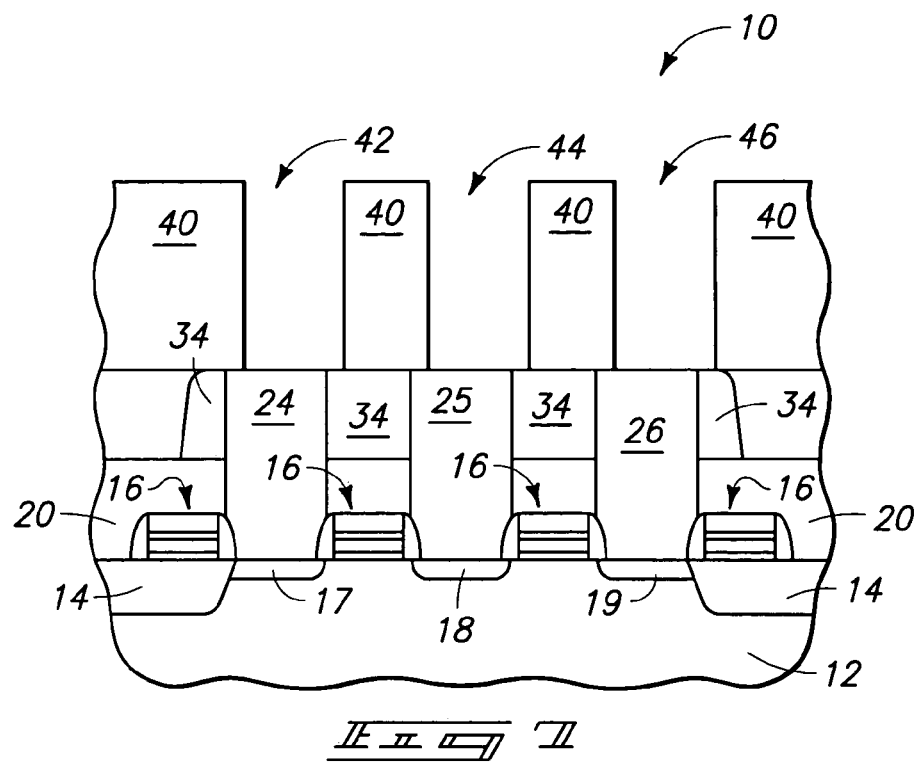
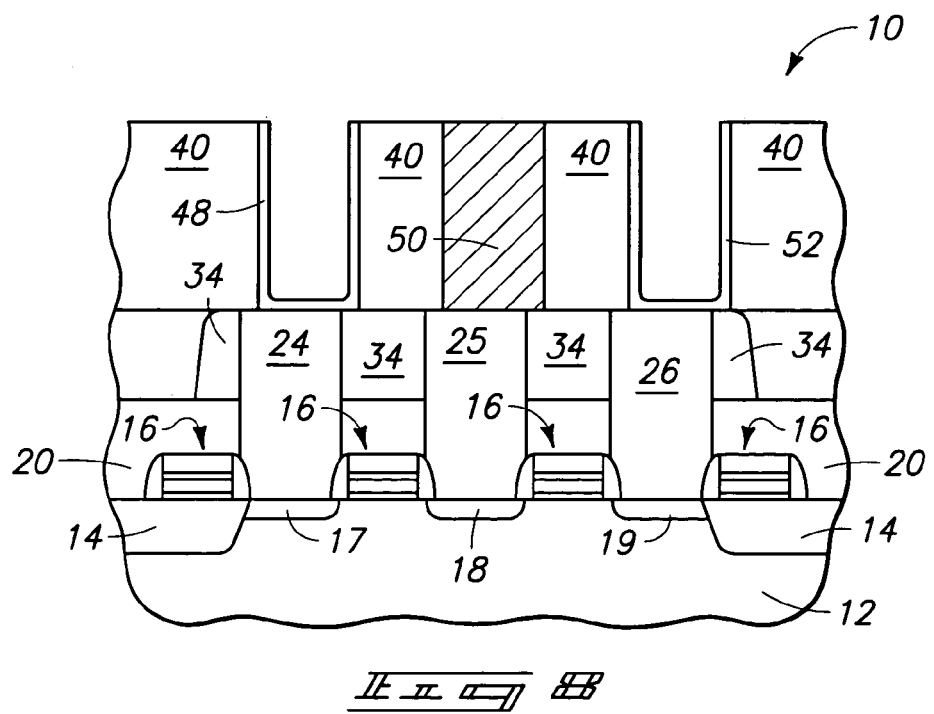

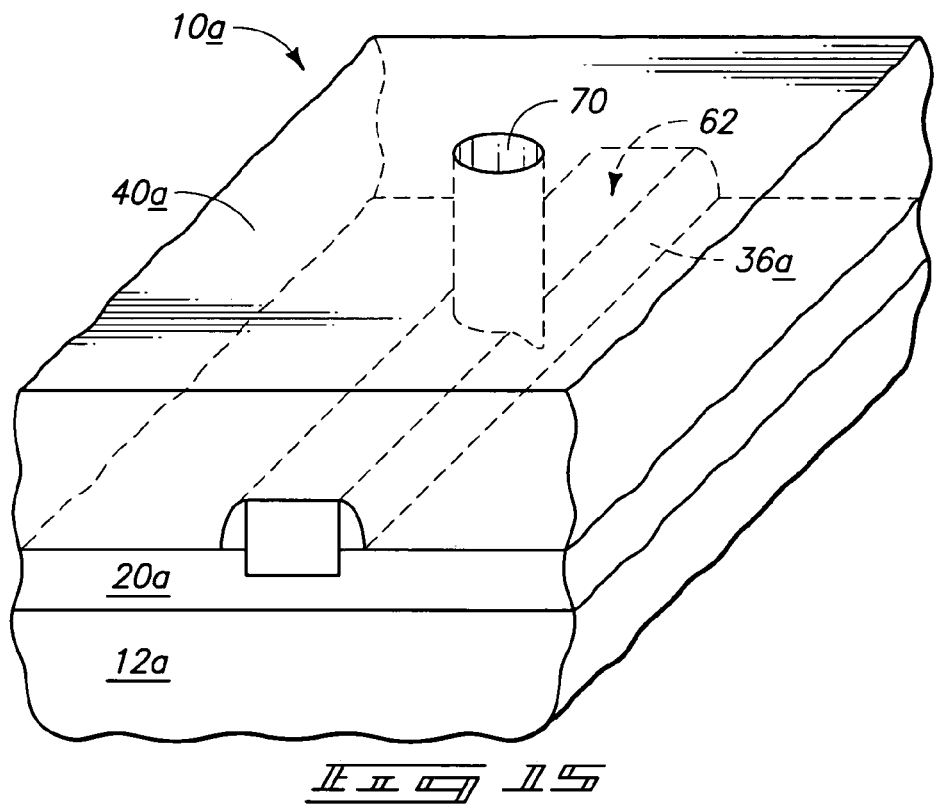
_Fig 15_
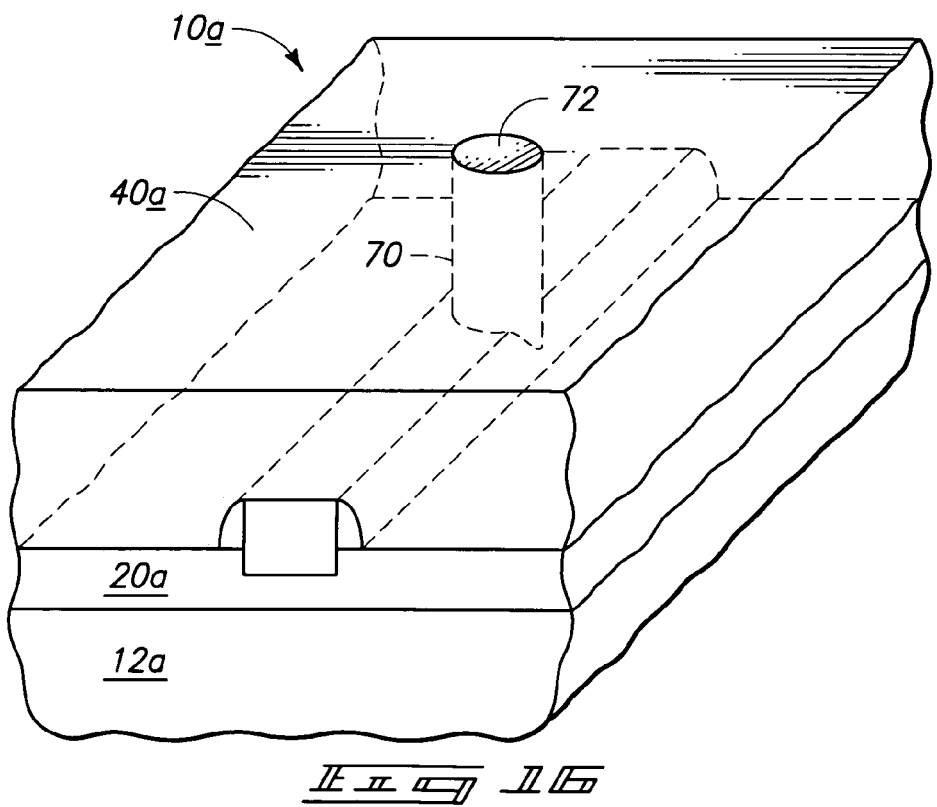
_Fig 16_

US 7,019,347 B2

DYNAMIC RANDOM ACCESS MEMORY CIRCUITRY COMPRISING INSULATIVE COLLARS

This patent resulted from a continuation application of U.S. patent application Ser. No. 10/264,676, filed on Oct. 3, 2002, entitled "Methods of Forming Conductive Contacts to Conductive Structures, and Integrated Circuitry", naming John M. Drynan and Thomas A. Figura as inventors, now U.S. Pat. No. 6,861,713, the disclosure of which is incorporated by reference; which patent resulted from a divisional application of U.S. patent application Ser. No. 09/999,513, filed Oct. 24, 2001, entitled "Methods of Forming Conductive Contacts to Conductive Structures", naming John M. Drynan and Thomas A. Figura as inventors, now U.S. Pat. No. 6,645,846, the disclosure of which is incorporated by reference.

TECHNICAL FIELD

This invention relates to methods of forming conductive contacts to conductive structures, and to integrated circuitry.

BACKGROUND OF THE INVENTION

Semiconductor wafer processing in the fabrication of integrated circuitry typically includes the formation of contact openings within insulating layers to underlying conductive structures. Currently, such processing is typically conducted by photolithography wherein a masking layer is deposited and a desired pattern of openings is formed therethrough. The masking layer is then used as a mask while chemical etching is conducted through the mask openings into the underlying insulative material to etch it largely selective to the masking layer such that the openings can be extended through the insulating material to the conductive structures therebeneath.

The intent, of course, is to very precisely align the reticle or other device used to form the desired opening patterns within the masking layer. If the openings are misaligned, the openings to be etched within the insulating layer(s) might include portions which extend laterally beyond the desired boundary of the conductive structure to which the openings are being etched. This can undesirably lead to etching of insulating material laterally of the conductive structure and sometimes lead to undesired exposure of other conductive structures. When the contact openings are filled with conductive material, this can of course lead to fatal shorts in the circuitry.

One prior art method of minimizing or attempting to prevent this tendency is to provide a thin blanket etch stop layer over the conductive structure prior to providing a thicker insulative material layer through which the primary contacts are intended to be made to the conductive structures. However, another masking step is typically utilized to make contact openings within the etch stop layer prior to provision of the thicker insulative layer thereover. The typical thin nature of the blanket deposited and photopatterned etch stop layer is such that a chemistry can typically be selected to etch the etch stop layer largely selective relative to the underlying conductive material and other insulative material beneath the etch stop layer. Subsequently, the etch stop layer will provide a degree of protection for mis-aligned contact openings being etched into the overlying insulative layer.

The following invention was motivated in addressing the above identified problems, although such is in no way so limited. The invention is limited only by the accompanying claims as literally worded without limiting reference to the specification, and in accordance with the doctrine of equivalence.

SUMMARY

The invention includes methods of forming conductive contacts to conductive structures, and to integrated circuitry. In one implementation, a method of forming a conductive contact to a conductive structure includes forming a conductive structure received within and projecting outwardly from a first insulative material. A second insulative material is deposited over the conductive structure. The second insulative material is different in composition from the first insulative material. The second insulative material is anisotropically etched effective to form a sidewall etch stop for the conductive structure. A third insulative material is deposited over the conductive structure and the sidewall etch stop. The third insulative material is different in composition from the second insulative material. A contact opening is etched through the third insulative material to the conductive structure using an etch chemistry which is substantially selective to the second insulative material of the sidewall etch stop.

In one implementation, integrated circuitry includes a plurality of conductive structures received within and projecting outwardly from a first insulative material. A plurality of isolated insulative collars is received about the conductive structures and over the first insulative material. The insulative collars comprise a material different from the first insulative material. A third insulative material is received over the conductive structures and insulative collars. The third insulative material is different from the collar material. A plurality of conductive contacts are formed to the conductive structures through the third insulative material.

In one implementation, integrated circuitry includes a conductive line received within and projecting outwardly from a first insulative material. The conductive line includes opposing sidewall portions which project outwardly from the first insulative material. A pair of insulative sidewall spacers is received over the sidewall portions and over the first insulative material. The sidewall spacers comprise a material different from the first insulative material. A third insulative material is received over the conductive line and the sidewall spacers. The third insulative material is different from the sidewall spacer material. A conductive contact is formed to the conductive line through the third insulative material.

BRIEF DESCRIPTION OF THE DRAWINGS

Preferred embodiments of the invention are described below with reference to the following accompanying drawings.

FIG. 1 is a diagrammatic perspective view of a semiconductor wafer fragment/section in process in accordance with an aspect of the invention.

FIG. 2 is a view of the FIG. 1 wafer fragment at a processing step subsequent to that shown by FIG. 1.

FIG. 3 is a view of the FIG. 2 wafer fragment at a processing step subsequent to that shown by FIG. 2.

FIG. 7 is a view of the FIG. 6 wafer fragment at a processing step subsequent to that shown by FIG. 6.

FIG. 8 is a view of the FIG. 7 wafer fragment at a processing step subsequent to that shown by FIG. 7.

FIG. 15 is a view of the FIG. 14 wafer fragment at a processing step subsequent to that shown by FIG. 14.

FIG. 16 is a view of the FIG. 15 wafer fragment at a processing step subsequent to that shown by FIG. 15.

DETAILED DESCRIPTION OF THE PREFERRED EMBODIMENTS

Figure 4:
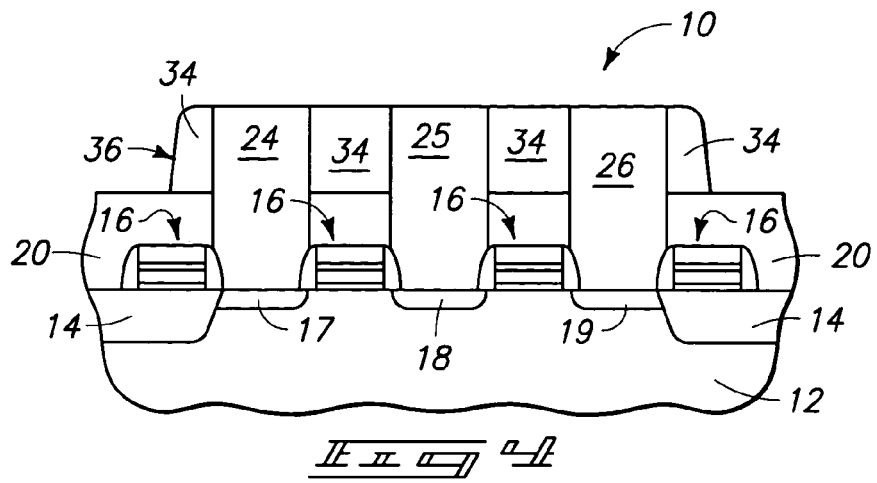
FIG. 4 is a view of the FIG. 3 wafer fragment at a processing step subsequent to that shown by FIG. 3.

This disclosure of the invention is submitted in furtherance of the constitutional purposes of the U.S. Patent Laws "to promote the progress of science and useful arts" (Article 1, Section 8).

One first preferred embodiment of a method of forming a conductive contact to a conductive structure, and integrated circuitry independent of the method of fabrication, is described with reference to FIGS. 1–8. FIG. 1 depicts a semiconductor wafer fragment 10 comprising of bulk monocrystalline substrate 12 having trench isolation regions 14 formed therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the terms "layer" and "material" encompass both the singular and the plural unless otherwise indicated.

FIG. 1 depicts partial fabrication of exemplary DRAM circuitry, with the depicted cross section showing a pair of DRAM memory cells. An exemplary material for substrate 12 is bulk monocrystalline silicon. A series of four wordlines 16 are shown formed over substrate 12/14. A series of diffusion regions 17, 18 and 19 are received within substrate 12 between isolation regions 14 and wordlines 16. Diffusion regions 17, 19, or source/drain regions 17, 19, will connect with storage nodes of storage capacitors, while diffusion region 18 will connect with a bit line.

A first insulative material 20 is deposited over the substrate, and is planarized. Material 20 may be homogenous, or comprise a plurality of different materials or layers. An exemplary preferred primary composition for material 20 is borophosphosilicate glass (BPSG). Contact openings 21, 22 and 23 have been formed through first insulative material 20 to proximate diffusion region 17, 18, 19, respectively. Such have been filled with conductive material to form a plurality of conductive structures 24, 25 and 26. An exemplary height/elevation above the diffusion regions for structures 24, 25 and 26 is from 1,000 Angstroms to 10,000 Angstroms. Such in the preferred embodiment accordingly project outwardly from diffusion region 17, 18, 19, respectively. Material or materials to form structures 24, 25 and 26 comprise one or more metals, metal compounds, conductively doped semiconductive materials, and mixtures thereof. The preferred embodiment implementation of FIG. 1 depicts projections 24, 25 and 26 in the form of upstanding pillars. Such provides but one exemplary embodiment in forming a conductive structure which projects outwardly relative to some underlying substrate. Pillars 24, 25 and 26 can be considered as having some outer region 28 the lateral portions of which are surrounded by first insulative material 20. In the illustrated and preferred embodiment, first insulative material 20 contacts projections 24, 25 and 26, and outer portions 28. Such provides but one exemplary embodiment of providing first insulative material proximate a conductive structure and over underlying substrate.

Referring to FIG. 2, a portion of first insulative material 20 is removed effective to expose respective opposing sidewall portions 30, 31 of the respective conductive structures, and leave the conductive structures 24, 25 and 26 projecting outwardly from first insulative material 20. The removing is preferably conducted by chemical etching. Such provides but one example of forming one or more conductive structures received within and projecting outwardly from a first insulative material. An exemplary preferred etching will leave from 500 Angstroms to 5,000 Angstroms (about 2,000 Angstroms being more preferred) of structures 24, 25 and 26 exposed above material 20.

Referring to FIG. 3, a second insulative material 34 is deposited over first insulative material 20 and conductive structures 24, 25, and 26 projecting outwardly therefrom. Second insulative material is different in composition from first insulative material 20. Where first insulative material 20 principally comprises an oxide such as BPSG, an exemplary preferred composition for material 34 is an insulative nitride, for example silicon nitride. An exemplary preferred deposition thickness range for layer 34 is from 100 Angstroms to 2,000 Angstroms. Preferably as shown, second insulative material 34 contacts conductive sidewall portions 30/31.

Figure 5:
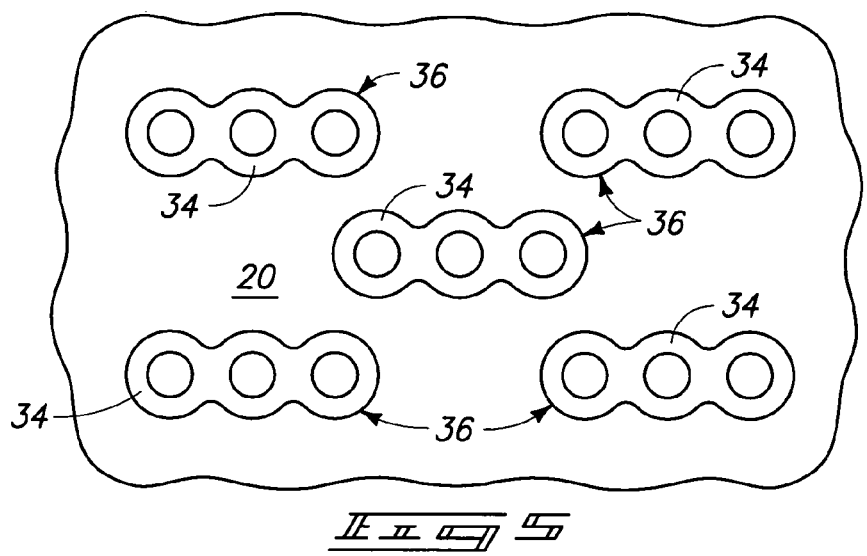
FIG. 5 is a top plan view of a larger portion of the wafer fragment in process, and corresponding in sequence to the processing of FIG. 4.

Referring to FIGS. 4 and 5, second insulative material 34 is anisotropically etched to form a sidewall etch stop 36 for the individual conductive structures. Any suitable chemistry, whether existing or yet-to-be-developed can be used. For example to etch silicon oxide or silicon nitride in a dry etch, one or more of a fluorocarbon or hydrofluorocarbon primary gas along with one or more secondary gases such as oxygen, nitrogen, or argon can be used. In the illustrated and preferred embodiment where the conductive structure is a pillar, the anisotropic etching preferably forms the sidewall etch stop 36 in the form of a series of interconnected collars which are received about the respective conductive pillars. FIG. 5 depicts a larger portion of the semiconductor wafer fragment in top perspective view showing a plurality of isolated etch stop collars 36 which are received about the conductive structures, which in this preferred embodiment constitute conductive pillars. As shown, at least some of the isolated etch stop collars 36 are formed to collar multiple conductive structures which project outwardly from first insulative material 20. The anisotropic etching of layer 34 is preferably conducted without providing any masking over any of substrate 12 during such etching.

Figure 6:
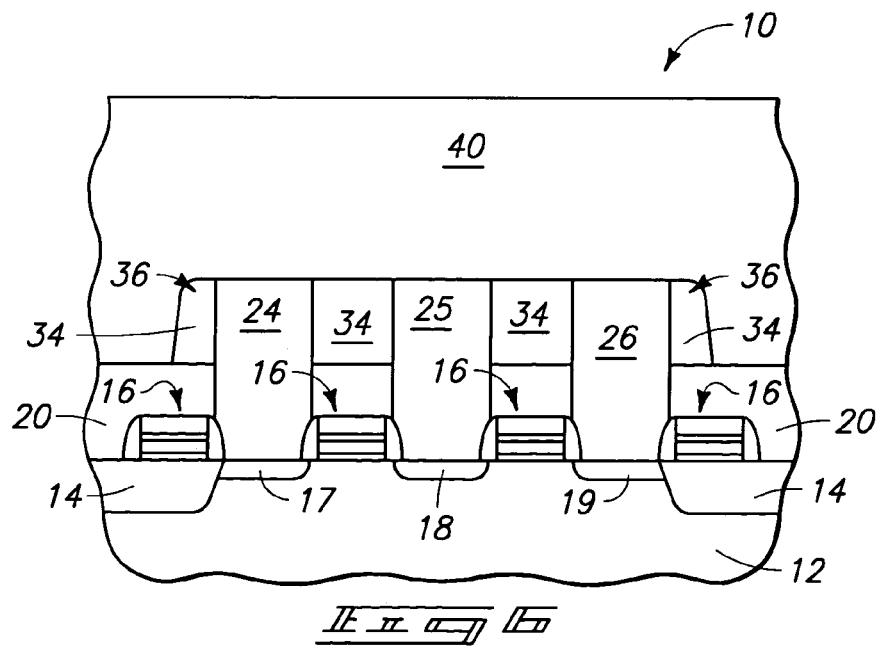
FIG. 6 is a view of the FIG. 4 wafer fragment at a processing step subsequent to that shown by FIG. 4.

Referring to FIG. 6, a third insulative material 40 is formed over conductive structures 24, 25 and 26 and sidewall etch stops 36. Third insulative material 40 is different in composition from second insulative material 34. First insulative material 20 and third insulative material 40 may be of the same composition, or may not be of the same composition. Further by way of example only, both may comprise the same or different oxides. One preferred embodiment forms second insulative material 34 to comprise an insulative nitride, and insulative materials 20 and 40 to comprise the same or different oxides. One specific preferred embodiment is to form layers 20 and 40 to comprise BPSG, and material 34 to comprise silicon nitride.

Referring to FIG. 7, contact openings 42, 44 and 46 are etched through third insulative material 40 to conductive structures 24, 25 and 26, respectively, using an etch chemistry which is substantially selective to second insulative material 34 of sidewall etch stops 36. In the context of this document, "substantially selective" means an etch ratio of one material to another of at least 2:1. The depicted processing shows openings 42, 44 and 46 being slightly misaligned to the right whereby such etching does ultimately expose sidewall etch stop 36.

Referring to FIG. 8, contact openings 42, 44 and 46 are at least partially filled with conductive material, thereby forming conductive contacts 48, 50 and 52 to conductive structures 24, 25 and 26 through third insulative material 40. In the depicted and preferred embodiments, contacts 48 and 52 constitute storage node capacitor plates, while contact 50 constitutes a plugging material for ultimate connection with a bit line in the depicted DRAM circuitry. Any existing or yet-to-be-developed processing(s) can be conducted to complete the circuitry fabrication.

Figure 9:
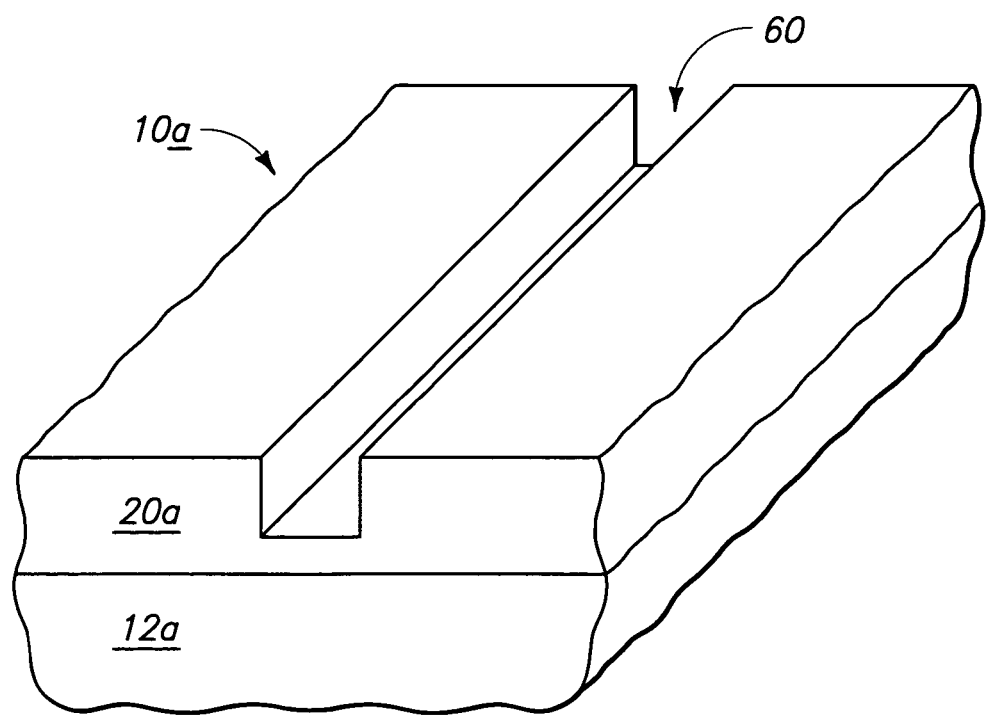
FIG. 9 is a diagrammatic perspective view of another semiconductor wafer fragment in process in accordance with an aspect of the invention.

But one additional alternative embodiment of many is next described with reference to FIGS. 9–16. Like numerals from the first described embodiment are utilized where appropriate, with differences being indicated with a suffix "a" or with different numerals. FIG. 9 depicts a semiconductor wafer fragment 10a having a first insulative material 20a formed over a bulk substrate 12a. A trough 60 has been formed in first insulative material 20a into some desired conductive line shape.

Figure 10:
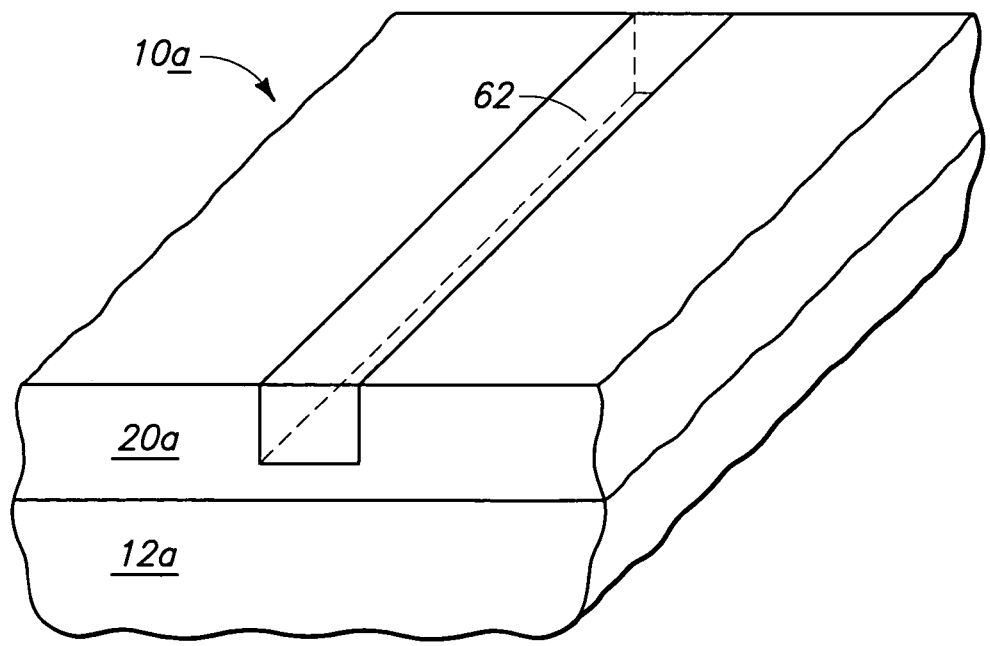
FIG. 10 is a view of the FIG. 9 wafer fragment at a processing step subsequent to that shown by FIG. 9.

Referring to FIG. 10, trough 60 has been at least partially filled with conductive material 62 effective to form a conductive line within trough 60. Any conductive metal, metal compound, alloy or conductively doped semiconductive material, or mixtures thereof, might be utilized.

Figure 11:
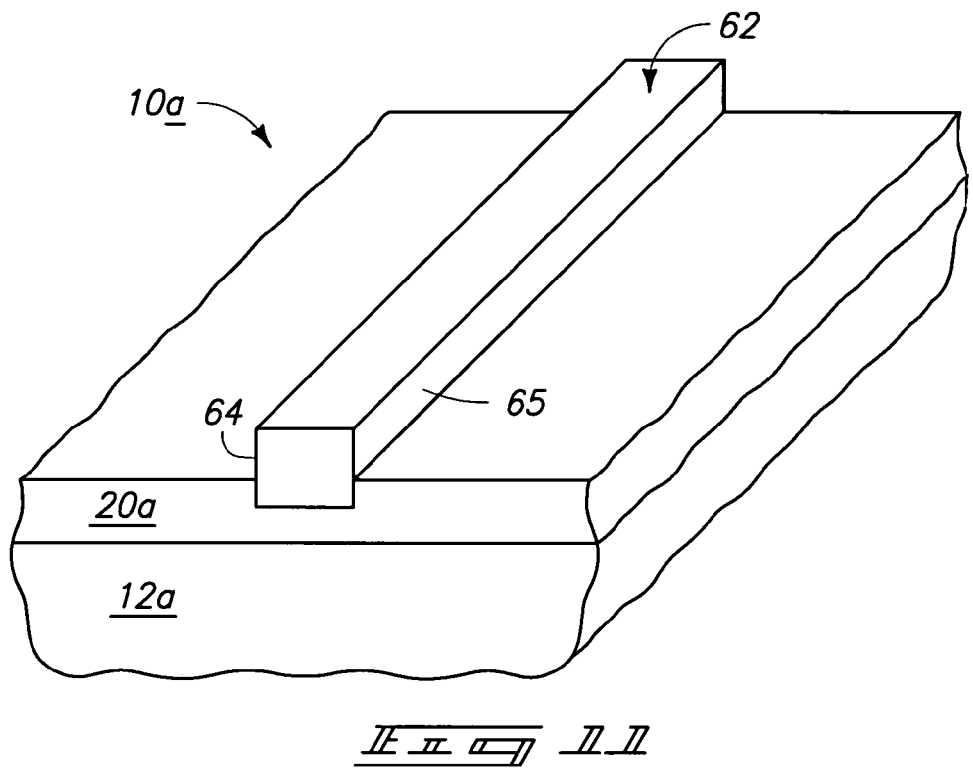
FIG. 11 is a view of the FIG. 10 wafer fragment at a processing step subsequent to that shown by FIG. 10.

Referring to FIG. 11, only some of first insulative material 20a is removed, preferably by chemical etching, effective to expose sidewall portions 64, 65 of conductive line 62. Again, such provides but one example of forming a conductive structure received within and projecting outwardly from a first insulative material, with the conductive structure here being in the form of a conductive line.

Figure 12:
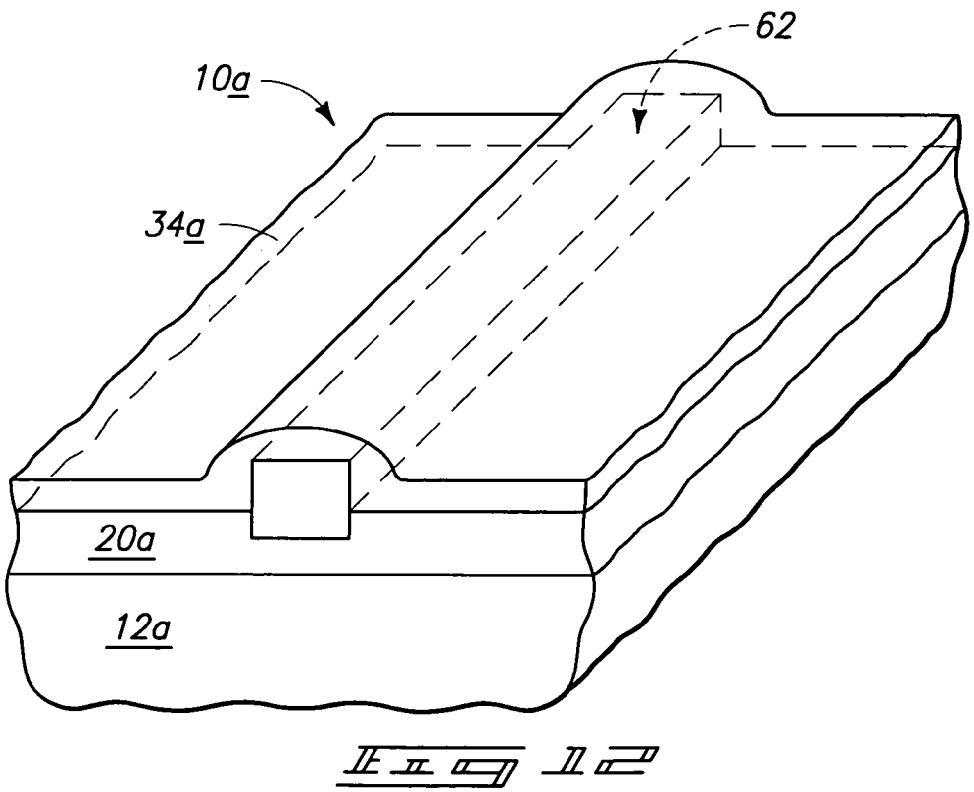
FIG. 12 is a view of the FIG. 11 wafer fragment at a processing step subsequent to that shown by FIG. 11.

Referring to FIG. 12, a second insulative material 34a is deposited over conductive line 62, exposed sidewall portion 64, 65 thereof, and first insulative material 20a. Second insulative material 34a is different in composition from first insulative material 20a. Exemplary materials and relationships are as those described above with respect to materials 20 and 34. Preferably, second insulative material 34a contacts exposed sidewall portions 64 and 65.

Figure 13:
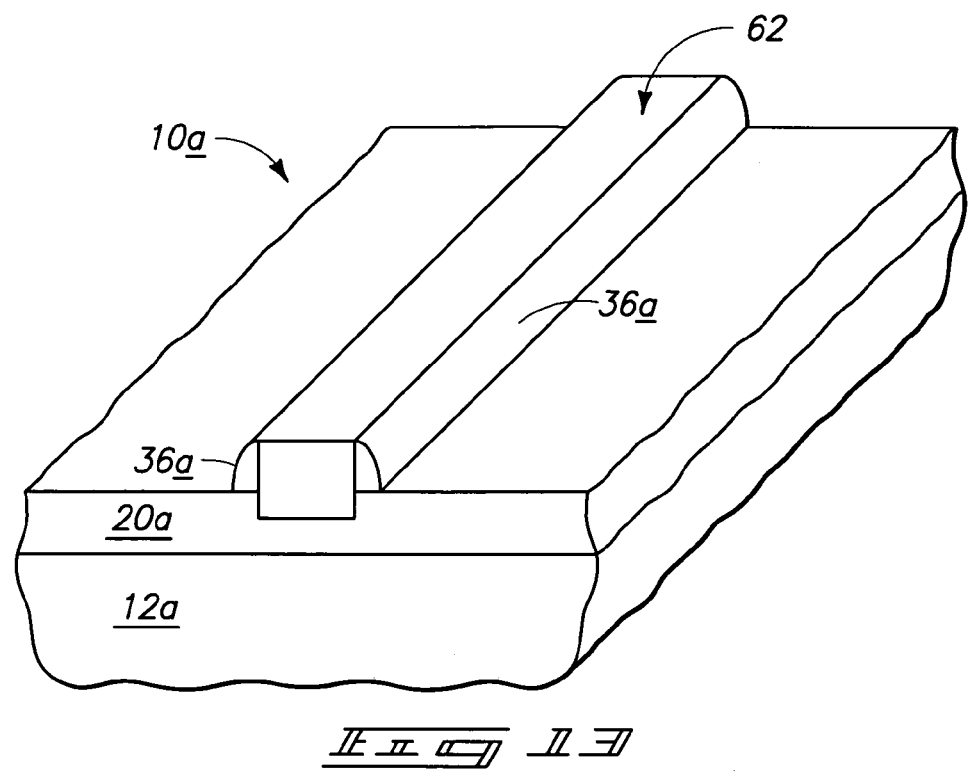
FIG. 13 is a view of the FIG. 12 wafer fragment at a processing step subsequent to that shown by FIG. 12.

Referring to FIG. 13, the second insulative material 34a is anisotropically etched effective to form sidewall etch stop spacers 36a over sidewall portions of conductive line 62 and over first insulative material 20a.

Figure 14:
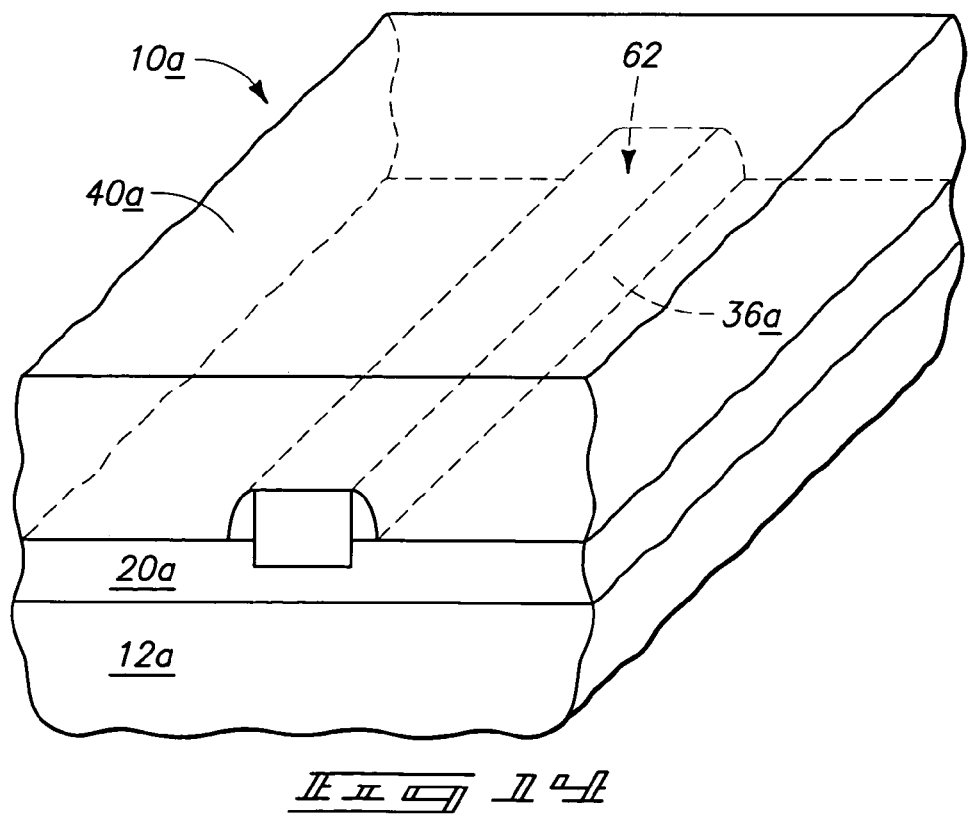
FIG. 14 is a view of the FIG. 13 wafer fragment at a processing step subsequent to that shown by FIG. 13.

Referring to FIG. 14, a third insulative material 40a is deposited over conductive line 62 and sidewall etch stop spacers 36a. Third insulative material 40a is different in composition from second insulative material 34a.0 Exemplary preferred materials and relationships relative to third insulative material 40a are as described above with respect to material 40.

Referring to FIG. 15, a contact opening 70 is etched through third insulative material 40a to conductive line 62 using an etch chemistry which is substantially selective to second insulative material 34a of sidewall etch stop spacer 36a. Contact opening 70 is shown being slightly misaligned such that the etching of its formation ultimately exposes one of etch stop spacers 36a.

Referring to FIG. 16, conductive material 72 is formed within contact opening 70, thereby in the illustrated embodiment forming a conductive contact to conductive line 62 through third insulative material 40a.

The invention also contemplates integrated circuitry independent of the method of fabrication.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. Dynamic random access memory circuitry comprising:
   a plurality of spaced conductive structures comprising conductive material which is received within and projecting outwardly from a first insulative material;
   a plurality of isolated insulative collars received about the conductive material of the spaced conductive structures and over the first insulative material, the insulative collars comprising a material different from the first insulative material;
   a third insulative material received over the spaced conductive structures and insulative collars, the third insulative material being different from the collar material; and
   a plurality of conductive contacts formed to the conductive material of the spaced conductive structures through the third insulative material, wherein at least some of the isolated insulative collars individually collar conductive material of multiple spaced conductive structures with material of said at least some of the isolated insulative collars being received within spaces between said multiple spaced conductive structures.

2. The dynamic random access memory circuitry of claim 1 wherein the conductive structures comprise conductive pillars.

3. The dynamic random access memory circuitry of claim 1 wherein the first and third insulative materials are not of the same composition.

4. The dynamic random access memory circuitry of claim 1 wherein the first and third insulative materials are of the same composition.

5. The dynamic random access memory circuitry of claim 1 wherein the collars comprise a nitride, and the first and third insulative materials comprise oxides.

6. The dynamic random access memory circuitry of claim 5 wherein the oxides are the same composition.

7. The dynamic random access memory circuitry of claim 5 wherein the oxides are not of the same composition.

8. The dynamic random access memory circuitry of claim 1 wherein the insulative collars contact the conductive material of the conductive structures.

9. The dynamic random access memory circuitry of claim 1 wherein the isolated insulative collars contact the first insulative material.

10. The dynamic random access memory circuitry of claim 1 wherein the third insulative material contacts the insulative collars.

* * * * *

UNITED STATES PATENT AND TRADEMARK OFFICE
CERTIFICATE OF CORRECTION

PATENT NO. : 7,019,347 B2  Page 1 of 1
APPLICATION NO. : 11/031478
DATED : March 28, 2006
INVENTOR(S) : John M. Drynan et al.

It is certified that error appears in the above-identified patent and that said Letters Patent is hereby corrected as shown below:

Col. 3, line 36 –
 Replace "semiconductor wafer fragment 10 comprising of bulk"
 Insert --semiconductor wafer fragment 10 comprised of bulk--

Col. 6, line 4 –
 Replace "composition from second insulative material 34*a*.0"
 Insert --composition from second insulative material 34*a*.--

Signed and Sealed this

Thirteenth Day of March, 2007

JON W. DUDAS
*Director of the United States Patent and Trademark Office*